(12) United States Patent
Higashiguchi et al.

(10) Patent No.: US 7,381,066 B2
(45) Date of Patent: Jun. 3, 2008

(54) PRINTED CIRCUIT BOARD WITH INTERCONNECTION TERMINAL, A PRINTED CIRCUIT ASSEMBLY AND ELECTRONIC APPARATUS

(75) Inventors: Masahiro Higashiguchi, Hyogo (JP); Kunihiro Tan, Hyogo (JP); Kazuhiro Yoneda, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/580,261

(22) PCT Filed: Sep. 29, 2005

(86) PCT No.: PCT/JP2005/017917

§ 371 (c)(1),
(2), (4) Date: May 25, 2006

(87) PCT Pub. No.: WO2006/035853

PCT Pub. Date: Apr. 6, 2006

(65) Prior Publication Data

US 2007/0111557 A1    May 17, 2007

(30) Foreign Application Priority Data

Sep. 29, 2004   (JP)   .............................. 2004-283078

(51) Int. Cl.
*H01R 12/00*    (2006.01)
(52) U.S. Cl. ...................................................... 439/83
(58) Field of Classification Search .................. 439/83, 439/78, 82, 55, 874, 876
See application file for complete search history.

(56) References Cited

U.S. PATENT DOCUMENTS

| | | | | |
|---|---|---|---|---|
| 4,787,853 A | * | 11/1988 | Igarashi | 439/55 |
| 5,014,162 A | * | 5/1991 | Clark et al. | 361/784 |
| 5,326,936 A | * | 7/1994 | Taniuchi et al. | 174/260 |
| 5,421,081 A | | 6/1995 | Sakaguchi et al. | |
| 6,175,086 B1 | | 1/2001 | Nakamura | |
| 6,179,631 B1 | * | 1/2001 | Downes et al. | 439/83 |
| 6,759,318 B1 | * | 7/2004 | Chang | 438/612 |
| 6,896,526 B2 | * | 5/2005 | Pitzele | 439/83 |
| 2004/0037057 A1 | * | 2/2004 | Okada | 361/760 |
| 2004/0137803 A1 | * | 7/2004 | Pitzele | 439/884 |

FOREIGN PATENT DOCUMENTS

JP    2002-100412 A    4/2002

* cited by examiner

*Primary Examiner*—Chandrika Prasad
(74) *Attorney, Agent, or Firm*—Dickstein Shapiro LLP

(57) ABSTRACT

A printed circuit board comprises a base substrate and an external interconnection terminal provided on the base substrate, wherein external interconnection terminal comprises a land formed on a front surface of the base substrate and a metal plate soldered upon the land via a solder layer, a through-hole being formed in the base substrate such that the through-hole penetrates through the land and through the base substrate, the through-hole being filled with a solder such that the solder in the through-hole extends in continuation to the solder layer connecting the metal plate to the land.

31 Claims, 9 Drawing Sheets

PRINTED CIRCUIT BOARD WITH INTERCONNECTION TERMINAL, A PRINTED CIRCUIT ASSEMBLY AND ELECTRONIC APPARATUS

TECHNICAL FIELD

The present invention relates to printed circuit boards having external connection terminals, a printed circuit assembly in which electronic components are mounted upon such a printed circuit board, and an electronic apparatus in which foregoing package is connected to form a circuit such as a protection circuit, or the like.

BACKGROUND ART

In recent years, significant advancements have been made in reduction of size and weight in electronic apparatuses. This trend of size reduction and weight reduction is particularly remarkable in portable apparatuses such as cellular phones. In relation to this, there is a demand for size reduction of printed circuit boards carrying various electronic components such as semiconductor devices and passive components.

In relation to the foregoing trend of technology, there is a demand for a built-in charging control circuit used with portable devices for controlling charging of secondary battery pack, such that the charging control circuit is integrated into the secondary battery pack. Thus, especially severe demand of size reduction is imposed on such a charging control circuit of secondary battery pack.

Meanwhile, electrical connection between the electrode of a secondary battery and a charging control circuit is achieved usually by using an interconnection lead of a nickel plate in the case the secondary battery is accommodated in the battery pack, in view of the fact that a nickel plate is used for the interconnection pattern taking out the electric power from the electrode with the secondary battery accommodated in a battery pack. By using such a nickel plate for the interconnection pattern, it becomes possible to connect the interconnection pattern to the electrode simply and directly by way of spot welding. Further, by using such a nickel plate, it becomes possible to eliminate the need of providing additional interconnection patterns for electrical interconnection between the secondary battery and the charging control circuit. Thereby, the size of the charging control circuit can be reduced further.

On the other hand, the use of such a nickel plate for the interconnection between the secondary battery and the charging control circuit imposes a demand to such a battery pack in that the external terminal of the printed circuit board carrying the charging control circuit should allow spot welding of nickel plate.

In order to meet for this demand, the external interconnection terminal of the printed circuit board used with such a secondary battery pack has been formed by forming a land on the surface of a base substrate of the printed circuit board in the form of a metal foil and by soldering a nickel plate on such a land.

For example, there is an external interconnection terminal as set forth in Patent Reference 1 in which a nickel plate is soldered upon a land formed on the surface of a printed circuit board via solder resist patterns formed so as to divide the land surface evenly. With such a construction, the tensile force acting upon the nickel plate with melting of solder is cancelled out by the tensile forces caused in the respective divided portions of the land. Thereby, precision of alignment of the nickel plate on the printed circuit board is improved together with the mechanical strength.

Further, there is proposed another construction as set forth in Patent Reference 2, in which a nickel plate having a U-shaped cutout or hole is soldered upon the surface of a printed circuit board. With such a construction, total length of solder filet formed at the time of soldering is increased, and mechanical strength of contact is improved at the same time.

Further, Patent Reference 3 discloses a construction of interconnection terminal formed on a printed circuit board, in which a metal plate is soldered upon a land formed on the printed circuit board for external connection, wherein a solder resist layer is formed between the land and the part of the metal plate on which an external lead wire is to be soldered. With such a construction, melting of the solder provided between the metal plate and the land is avoided at the time of soldering a lead wire to the metal plate, and drifting of the metal plate away from the land is prevented.

Thus, with this reference, the lead wire is soldered on the foregoing part of the metal plate in which the solder resist exists between the metal plate and the land. By soldering the lead wire to such a part of the metal plate not soldered directly to the land, it becomes possible to prevent the melting of the solder layer connecting the metal plate to the land. Thereby, the problem of displacement of the metal plate with regard to the land during the soldering work of the lead wire as a result of melting of the solder between the is successfully prevented.

REFERENCES

Patent Reference 1 Japanese Laid-Open Patent Application 2002-100412 official gazette Patent Reference 2 Japanese Laid-Open Patent Application 2002-111170 official gazette Patent Reference 3 Japanese Laid-Open Patent Application 10-321981 official gazette

DISCLOSURE OF THE INVENTION

While the external interconnection terminals of foregoing references of soldering a metal plate upon a land have been devised for increasing the mechanical strength of the external interconnection terminal, such prior art merely anticipate for soldering of a lead wire, or the like, upon such an external interconnection terminal, and do not anticipate interconnection of a metal plate by way of spot welding.

When a metal plate soldered upon such a land has been pulled by force as in the case of spot welding, there can appear one of the following two states: the first being the state in which peeling destruction occurs at the solder layer connecting the metal plate to the land; and the second being the state in which peeling destruction occurs at the land such that the land is pulled apart from the printed circuit board while carrying the metal plate soldered thereon.

The former situation occurs in the case pores are formed between the metal plate and the land at the time the metal plate is placed on the land and the pores thus formed have remained even after the solder paste provided between the land and the metal plate has caused reflowing. In such a case, the effective area of soldering becomes insufficient and hence insufficient mechanical strength for the solder layer. On the other hand, the latter situation occurs in the case the contact area between the land and the printed circuit board is reduced as a result of size reduction of the land.

Thus, a first object of the present invention is to provide a printed circuit board having an increased mechanical strength for the external interconnection terminal thereof particularly for the part between the land and the printed circuit board, such that the external interconnection terminal can bear the stress at the time of connecting another metal plate to the external interconnection terminal by way of spot welding, without causing peeling of the land from the printed circuit board.

A second object of the present invention is to provide a printed circuit assembly in which electronic components are mounted on such a printed circuit board.

A third object of the present invention is to provide an electronic apparatus having such a printed circuit assembly.

Thus, the printed circuit board of the present invention has an external interconnection terminal on the surface of a base substrate in the form of a metal plate soldered upon a land formed on such a base substrate by a metal foil.

In a first aspect of the present invention, there is provided a through-hole in the printed circuit board penetrating through the land and a base substrate of the printed circuit board, such that the penetrating-hole is filled with a solder alloy continuously to the solder layer connecting the land and the metal plate.

Preferably, there is formed a second land at the rear surface of the printed circuit board so as to oppose the first-mentioned land across the base substrate of the printed circuit board, such that the second land at the rear surface is connected to the first-mentioned land at the front surface via the through-hole.

Such a through-hole can be provided in plural numbers in each land. Thereby, the number and arrangement of the through-holes can be determined according to the size of the land and the force exerted upon the external interconnection terminal at the time of the spot welding.

Further, it is preferable to form a solder resist on such a printed circuit board so as to cover continuously from the peripheral edge part of the land formed on the surface of the base substrate to the part of the base substrate surrounding the land.

Further, it is possible to form the solder resist layer on a part of the land surface formed at the front surface of the base substrate.

Thereby, it is preferable that the solder resist layer thus formed on the land is formed so as to divide the region in which the land is soldered to the metal plate into plural sub-regions. Further, it is preferable that such a solder resist layer extends to the outside of the land across the land peripheral edge.

Further, it is preferable that the solder resist layer at the peripheral edge part of the land and the solder resist layer inside the land form a structure dividing the region of the land, in which the land is soldered to the metal plate, into plural sub-regions.

According to a second aspect of the present invention, the printed circuit board is not provided with the through-hole, and there is provided a solder resist layer to extend continuously from the peripheral edge part of the land on the base substrate to the region of the base substrate surrounding the land.

In this case, too, it is possible to form a solder resist layer in a part of the land surface at the front surface of the base substrate.

In this case, it is preferable that the solder resist layer formed inside the land divides the region of the land soldered to the metal plate into plural sub-regions.

Further, it is preferable that the solder resist layer at the peripheral part of the land surface and the solder resist layer inside the land form a structure dividing the region of the land soldered to the metal plate into sub-regions.

Preferably, the solder resist layer used with the present invention is identical to the solder resist layer used for protecting the interconnection patterns on the base substrate.

It is preferable that the metal plate soldered to the land at the external interconnection terminal has an area larger than the area of the land and disposed such that the metal plate covers the land over the entirety thereof.

Further, the printed substrate assembly of the present invention comprises the printed circuit board as noted above and the electronic components carried thereon.

Further, the electronic apparatus of the present invention comprises the printed circuit assembly as set forth above and an electronic device connected to the printed circuit assembly via an interconnection metal plate such that the interconnection metal plate is connected to the metal plate of the external interconnection terminal of the printed circuit board by spot welding.

In an example, the interconnection metal plate and the metal plate of the external interconnection terminal of the printed circuit board comprises a plate of nickel or nickel alloy.

An example of such an electronic apparatus is a secondary battery pack in which a secondary battery and a charging control circuit thereof are integrated. In such secondary battery pack, the secondary battery constitutes the electronic device to be connected, while the charging control circuit of the secondary battery constitutes the printed circuit substrate assembly in the form of a semiconductor integrated circuit mounted on the printed circuit substrate as the electronic component.

According to the printed circuit substrate of the first aspect of the present invention, in which there is formed a through-hole in the external interconnection terminal so as to penetrate through the land and further through the base substrate and in which the through-hole is filled with a solder alloy continuing to the solder layer connecting the land and the metal plate with each other, there is formed a structure in which the land is connected mechanically to the base substrate with the solder alloy, and the mechanical strength of the land for resisting from being peeled off from the base substrate is increased. Thereby, dropping of the external interconnection terminal from the printed circuit board is prevented effectively even in the case a large force is exerted to the metal plate soldered upon the land.

Further, with such a construction, the heat at the time of spot welding dissipates efficiently to the substrate via the through-hole, and the problem of the molten solder alloy causing scattering is prevented.

Further, by forming a second land at the rear side of the base substrate so as to oppose the first-mentioned land at the front surface of the base substrate and by connecting the land at the front surface with the land at the rear surface by the solder in the through-hole, there appears the structure in which the land at the front surface and the land at the rear surface are mechanically connected, and the resistance of the land from being peeled off and dropping from the printed circuit board is improved further with such a structure of sandwiching the base substrate of the printed circuit board by the first and second lands.

Further, by forming the solder resist layer so as to cover continuously the peripheral part of the land surface and the part of the base substrate surrounding the land, the peripheral edge of the land is held by the solder resist film, and the resistance of the land from being peeled off from the printed circuit substrate is improved further. Further, such a solder resist layer at the peripheral edge of the land can successfully prevent the problem of scattering of the molten solder alloy at the time of spot welding.

Further, by forming a solder resist layer in a part of the land surface, such a solder resist layer can be used to prevent scattering of the molten solder at the time of the spot welding made to the metal plate.

By providing the solder resist layer on the land such that the solder resist layer extends to the outside of the land, or by providing the solder resist layer at the peripheral part of the land and inside the land, such that the region of the land soldered to the metal plate is divided into plural regions, formation of pores between the land and the metal plate at the time of soldering the metal plate is suppressed, and it becomes possible to increase the effective area for soldering. Thereby, the mechanical strength of the structure of the metal plate and the land is improved.

Further, by forming the solder resist layer so as to extend continuously from the peripheral edge part of the land to the part of the base substrate surrounding the land also in the printed circuit board not formed with the through hole penetrating the land and the base substrate, the peripheral edge of the land is held by the solder resist layer thus formed so as to cover the peripheral edge part of the land and the part of the base substrate surrounding the land continuously, and the resistance of the land from being pulled off from the printed circuit board is increased. Further, the solder resist layer covering the peripheral edge part of the land surface functions also to prevent scattering of the molten solder at the time of spot welding.

In such a case, too, by forming a solder resist layer in a part inside the land, scattering of molten solder alloy at the time of the spot welding can be prevented with such a solder resist layer. Further, by dividing the soldering region between the land and the metal plate by the solder resist layer at the peripheral edge part of the land and the surrounding region, formation of pores between the land and the metal plate at the time of soldering of the metal plate is suppressed, and it becomes possible to increase the effective area of soldering. Thereby, the resistance of the metal plate and the land from being peeled off is improved.

Further, by using a solder used also for protecting the interconnection patterns on the base substrate for the solder resist layer, it is possible to avoid increase of the number of the process steps.

By increasing the area of the metal plate to be larger than the area of the land soldered thereto, and by disposing the metal plate such that the entirety of the land is covered with the metal plate, it becomes easier to connect another metal plate thereto.

Further, by forming a printed circuit assembly by mounting an electronic component on such a printed circuit board and by connecting a metal plate of an electronic apparatus with the metal plate of the external interconnection terminal of the printed circuit board by spot welding, interconnection to the electronic apparatus such as a battery in which the electronic plate is spot-welded as an electrode is achieved easily.

Further, by using a nickel plate or nickel alloy plate for the metal plates connected with each other, spot welding can be achieved easily. Further, the metal plate of nickel or nickel alloy does not cause corrosion easily.

BRIEF DESCRIPTION OF THE DRAWINGS

FIG. 1A is a plan view diagram showing a printed circuit board according to an embodiment of the present invention in the state of carrying an electronic component thereon while

FIG. 3A is a plan view diagram showing a printed circuit board according to another embodiment of the present invention in the state of carrying an electronic component thereon while

FIG. 9A is a plan view diagram showing a printed circuit board according to a further embodiment of the present invention in the state of carrying an electronic component thereon while

FIG. 10A is a plan view diagram showing a printed circuit board according to a further embodiment of the present invention in the state of soldering a metal plate on the external interconnection terminal thereof while

FIG. 11A is a plan view diagram showing a printed circuit board according to a further embodiment of the present invention in the state of carrying an electronic component thereon while

FIG. 12A is a plan view diagram showing the printed circuit board according to a further embodiment of the present invention in which a second metal plate is spot-welded upon the external interconnection terminal thereof while

BEST MODE FOR IMPLEMENTING THE INVENTION

Hereinafter, the present invention will be explained for preferred embodiments with reference to the drawings.

First Embodiment

Figure 1A:
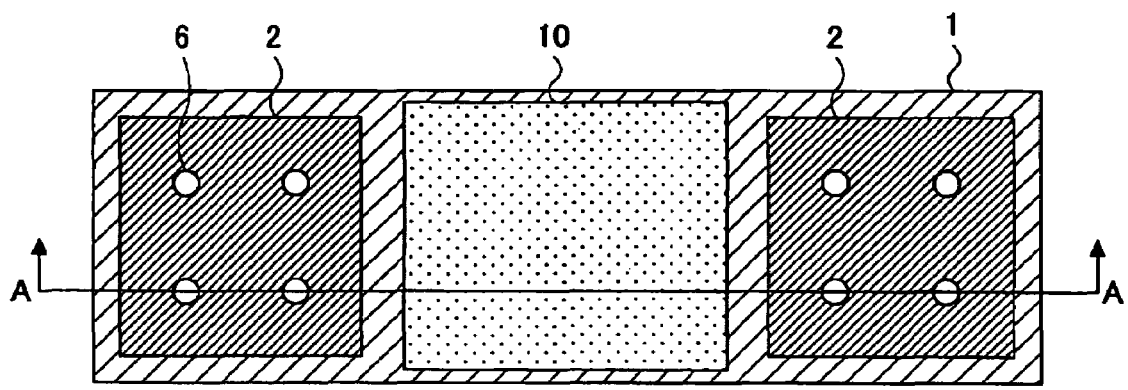
Figure 1B:
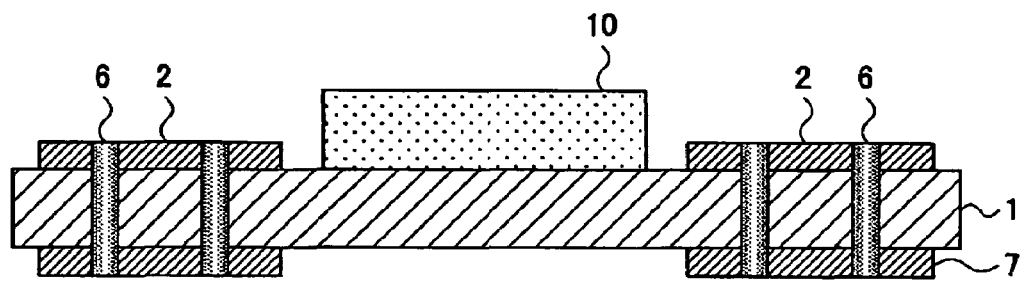
FIG. 1B is a cross-sectional diagram taken along an A-A line in FIG. 1A.

FIG. 1A is a plan view diagram showing a printed circuit board 40 according to a first embodiment of the present invention in the state of carrying an electronic component thereon while FIG. 1B is a cross-sectional diagram taken along an A-A line in FIG. 1A.

Referring to FIGS. 1A and 1B, the printed circuit board 40 comprises an insulating base substrate 1 carrying a metal film such as a copper film on the surface thereof, wherein the metal film thus formed is patterned to form a circuit pattern not illustrated and a land 2 connected to the circuit pattern.

Further, the printed circuit board 40 carries an electronic component 10, which may be a charging control circuit of a secondary battery configured in the form of integrated circuit or a passive component, wherein the electronic component 4 is connected to the foregoing circuit pattern formed on the base substrate 1. It should be noted that the land 2 is formed in electrical connection with the circuit pattern formed in the region on which the electronic component 10 is mounted.

It will be noted that the land 2 is formed with through-holes 6 such that the through-holes 6 are provided with metal plating at the inner wall surface thereof. In the case the printed circuit board 40 is a two-sided substrate, there are formed a land and a circuit pattern also on a rear surface of the base substrate 1, wherein the through-hole provides an electrical interconnection between the front side land and the rear side land or between the front side circuit pattern and the rear side circuit pattern.

Further, in the case the printed circuit substrate 40 is a multilayer interconnection substrate, there are formed also internal circuit patterns embedded inside the base substrate. Thereby, the through-hole 6 provides an electrical interconnection between these internal circuit patterns or between one of the internal circuit patterns and the land or interconnection pattern at the front surface or rear surface of the base substrate 1.

In the present embodiment, the through-hole 6 is filled with a solder alloy, wherein the solder alloy thus filling the through-hole provides a mechanical connection between the land 2 and the base substrate 1. In the case of the multilayer interconnection structure, the solder alloy thus filling the through-hole provides also an electrical connection interconnection between the internal circuit patterns. Thus, with the printed circuit board of the present embodiment, the land 2 is mechanically connected to the base substrate 1 via the solder alloy in the through hole 6, and with this, the resistance of the land 2 from being pulled off from the base 1 is increased significantly.

With the embodiment of FIG. 1, it should further be noted that there is formed a second land at the rear surface of the base substrate 1 so as to oppose the land 2, wherein electrical as well as mechanical connection is achieved between the land 2 and the land 7 via the solder alloy filling the through-hole 6. With such a structure, the land 2 is not only connected to the base substrate 1 via the solder alloy in the through-hole 6 but also to the land 7 at the rear side, and thus, the resistance of the land 2 from being pulled off from the substrate 1 is increased further.

Figure 2:
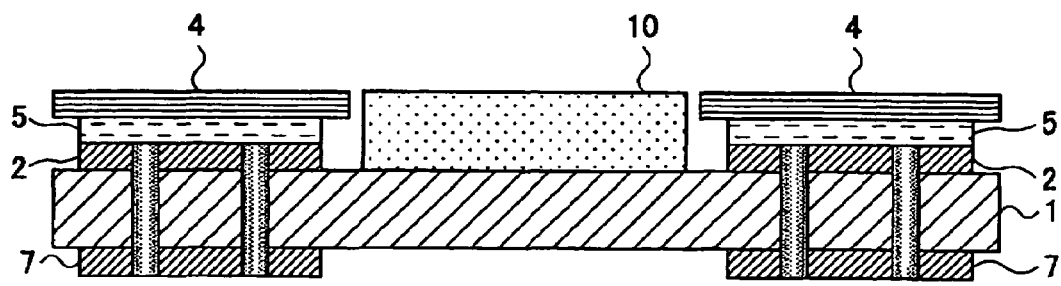
FIG. 2 is a diagram showing the printed circuit board of the embodiment of FIGS. 1A and 1B in the state a metal plate is soldered upon an external interconnection terminal thereof.

FIG. 2 is shows the printed circuit board 40 of the present embodiment in the state that a metal plate is provided on the land 2 as an external interconnection terminal.

Referring to FIG. 2, the metal plate 4 is formed to have an area larger than the area of the land 2 in anticipation of spot welding conducted for interconnection with external electronic apparatuses, wherein the metal plate 4 is soldered upon the land 2 via a solder layer 5 with alignment such that the plate 4 covers the entirety of the land 2. In the case that the electronic apparatus used with the printed circuit board is a secondary battery, it is preferable that a nickel plate is used for the metal plate 4 in anticipation with spot welding thereto.

In the example of FIG. 2, the external interconnection terminal is formed by connecting the metal plate 4 to the land 2 and the land 7 is provided at the rear side of the substrate 1. However, it should be noted that the present invention also includes a printed circuit board in which the land 7 is not provided on the rear side of the base substrate 1.

Further, such a construction facilitates dissipation of heat at the time of spot welding of electrode of external electronic apparatus such as the secondary battery to the metal plate 4. Thus, the heat at the time of the spot welding dissipates efficiently to the substrate via the through-hole 6, and with this, scattering of the molten solder 5 is effectively prevented.

In order to solder the metal plate 4 to the land 2 by filling the solder alloy in the through-hole 6, a solder paste is applied on the surface of the land 2 and the metal plate 4 is placed on the land 2. Then, the printed circuit board 1 is caused to pass through a reflow furnace, wherein the solder paste undergoes melting and the solder alloy layer 5 is formed so as to connect the metal plate 4 to the land 2. At the time of such a reflowing process caused in the reflowing furnace, the molten solder alloy flows also into the through-hole 6, and the land 2 is firmly connected mechanically also to the base substrate 1 and to the second land 7.

While there are formed four through-holes in the examples of FIGS. 1 and 2, the number of the through-holes 6 is by no means limited to four but can be increased or decreased according to the size of the land 2. Further, the through-holes 6 may be formed with an optimum arrangement determined in view of the size of the land 2 and in consideration of the locations where the mechanical stress acting on the interconnection terminal for pulling off the metal plate 4 becomes the largest.

Second Embodiment

Figure 3A:
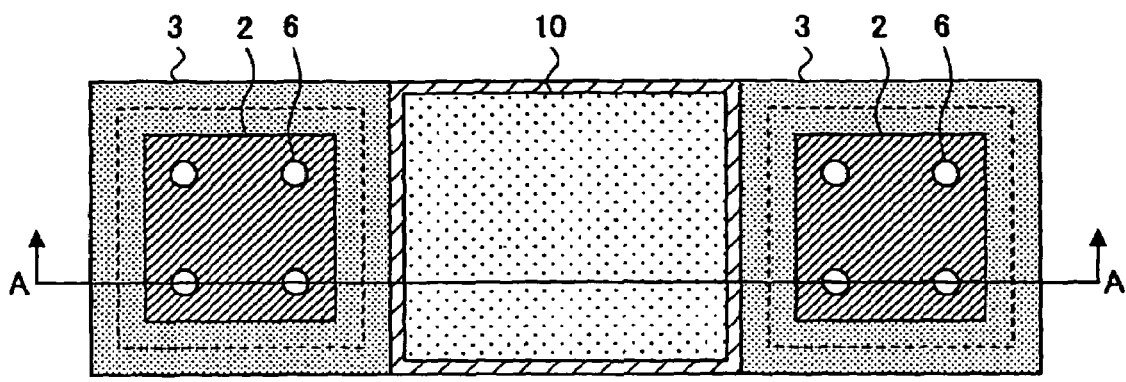
Figure 3B:
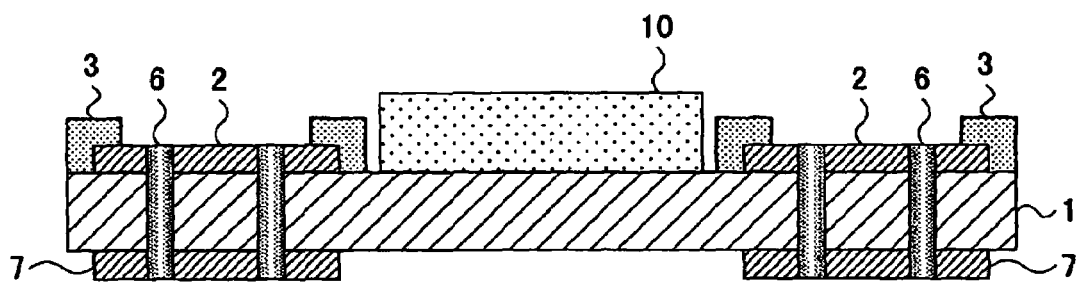
FIG. 3B is a cross-sectional diagram taken along an A-A line in FIG. 3A.

FIGS. 3A and 3B show a printed circuit board 50 according to a second embodiment of the present invention, wherein those parts corresponding to the parts described previously are designated by the same reference numerals and the description thereof will be omitted.

Referring to FIGS. 3A and 3B, it can be seen that there is provided a solder resist layer on the structure of FIGS. 1A and 1B such that the solder resist layer 3 extends continuously from the peripheral edge part of the land 2 to the part of the base substrate 1 surrounding the land 2.

By covering the peripheral edge of the land 2 with the solder resist layer 3, the mechanical stability of the land 2 resisting from being pulled off from the base substrate 1 is improved further.

Figure 4:
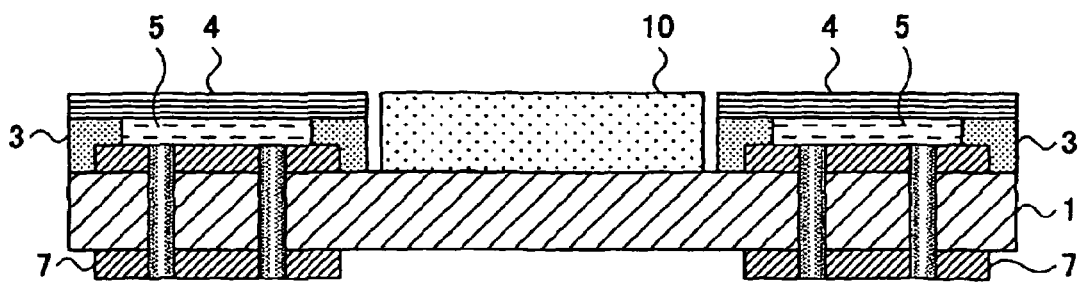
FIG. 4 is a diagram showing the printed circuit board of the embodiment of FIGS. 3A and 3B in the state a metal plate is soldered upon an external interconnection terminal thereof.

FIG. 4 shows the printed circuit board 50 of the third embodiment in the state that the metal plate 4 is soldered upon the land 2 of the printed circuit board 50 by way of the solder alloy layer 5.

By reinforcing the land 2 with the solder alloy filling the through-holes 6 and further with the solder resist layer 3 with the printed circuit board 50 of the present invention, it becomes possible that to prevent the external interconnection terminals from being pulled off from the base substrate 1 even in the case a large stress is applied to the metal plate 4. Further, such a solder resist layer 3 functions to prevent scattering of the molten alloy in the event of carrying out a spot welding of an electrode of the electronic apparatus such as a secondary battery to the metal plate 4.

In FIGS. 3 and 4, in which there is formed a second land 7 at the rear side of the base substrate 1 and the land 2 and the land 7 are connected by the solder alloy in the through-hole 6, the resistance of the land 2 from being pulled off from the base substrate 1 is improved further as compared with the case in which the land 7 is not provided on the rear side of the base substrate 1. However, the present embodiment also covers such a construction in which the land 7 is not provided on the rear side of the base substrate 1.

It should be noted that a solder resist is an insulation film used for protecting a circuit pattern when soldering an electronic component mounted on a substrate, and is typically formed of a heat resistant resin such as epoxy resin. The present embodiment can also use such a conventional solder resist for the solder resist layer 3.

The solder resist layer 3 may be formed by a process of applying a solder resist on the entire surface of the printed circuit board and then form a resist pattern on the part where the solder resist layer should be retained. Thereby, the solder resist layer is patterned by an etching process while using the resist pattern as a mask. Alternatively, it is possible to form a solder resist layer selectively by a screen printing process, or the like.

Further, it is possible to use a photosensitive solder resist for the solder resist layer 3. For example, it is possible to use a UV-cure solder resist material, which is a solder resist material undergoing curing with ultraviolet radiation. In the case of using a UV-cure solder resist, the part of the solder resist layer to be removed is covered by a UV-cut mask, and UV irradiation is applied via the UV-cut mask. Thereby, the part of the solder resist layer not covered with the mask undergoes curing, and the uncured part of the resist layer is removed by a developing solution. Further, the remaining solder resist pattern is applied with thermal curing process.

Third Embodiment

FIGS. 5 through 8 show examples of the land 2 according to a third embodiment of the present invention in which various solder resist patterns are formed on the land 2. It should be noted that each example described hereinafter covers the case in which the land 7 is provided on the rear side of the base substrate 1 and the case in which such a land 7 is not provided.

Figure 5:
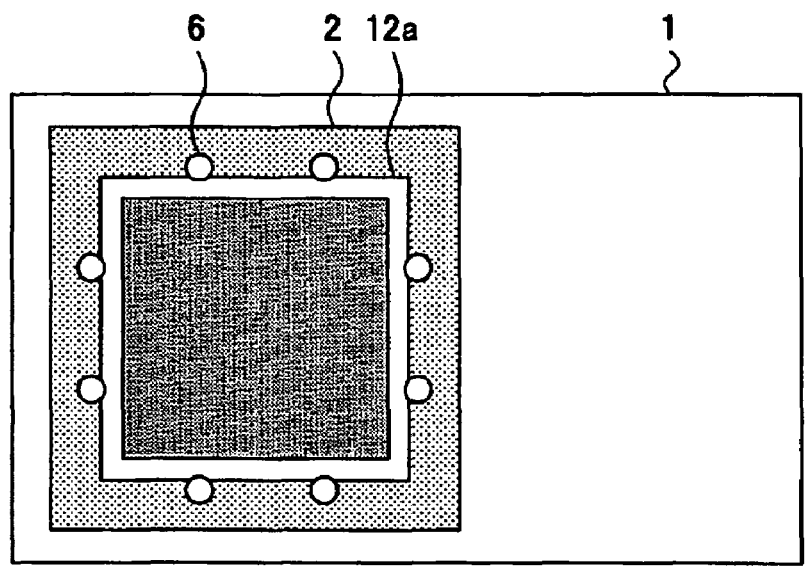
FIG. 5 is a plan view diagram showing the external interconnection terminal of the printed circuit board according to a further embodiment of the present invention.

In the example of FIG. 5 showing a printed circuit board 60A, there is formed a solder resist layer 12a in the form of a frame pattern extending along the peripheral edge of the land 2. Contrary to the solder resist layer 3 of the embodiment of FIGS. 3A and 3B in which the solder resist layer 3 extends continuously from the peripheral edge part of the land 2 to the part of the base substrate 1 surrounding the land 2, the solder resist pattern 12A is formed exclusively inside the area of the land 2.

Further, in the illustrated example, there are formed plural thorough-holes 6 in the land 2. While the positional relationship of the through-holes 6 and the solder resist layer 12a is not limited, the example of FIG. 5 disposes the through-holes along the outer edge of the frame-like solder resist pattern 12a.

By forming the through-holes 6 and the solder resist pattern 12a as such, not only the bonding strength of the land 2 to the base substrate 1 of the printed circuit board 60A is improved but also the efficiency of dissipation of the heat at the time of spot welding of the metal plate. The heat dissipates to the base substrate 1 via the through holes 6. Thereby, the molten solder alloy is held by the solder resist layer 12a, and thus, scattering of the molten solder alloy to the outside is effectively prevented as long as the spot welding is conducted inside the frame structure of the solder resist pattern 12a. Further, because of formation of the fillet at the peripheral edge of the land 2, the effective soldering area is increased and the bonding strength of the metal plate 4 is increased further.

Figure 6:
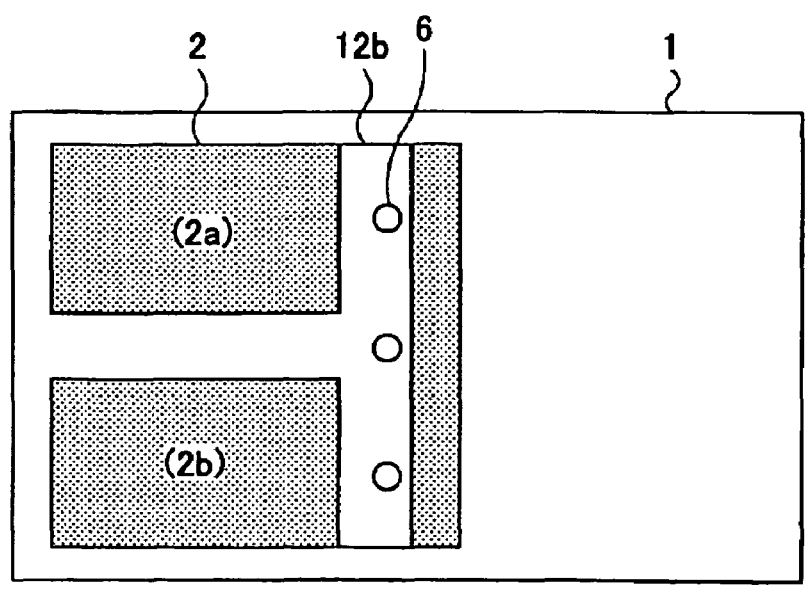
FIG. 6 is a plan view diagram showing the external interconnection terminal of the printed circuit board according to a further embodiment of the present invention.

In the example of FIG. 6 showing a printed circuit board 60B, there is provided a T-shaped solder resist pattern 12b on the land 2. In this example, too, it can be seen that there are provided plural through-holes 6. While the positional relationship between the through-holes 6 and the solder resist pattern 12b is not limited, the illustrated example has a construction of disposing the through-holes 6 inside the vertical part of the T-shaped solder resist pattern 12b.

By forming the through-holes 6 and the solder resist pattern 12b of T-shaped form as such, not only the bonding strength of the land 2 and the base substrate 1 of the printed circuit board is improved by way of the through-holes 6 but also the efficiency of heat dissipation at the time of spot welding of a metal plate upon the metal plate 4 soldered to the land 2. The heat dissipates to the base substrate 1 via the through holes 6. Thereby, the molten solder alloy is held by the solder resist layer 12a, and thus, scattering of the molten solder alloy to the outside in the right direction of the vertical solder resist pattern 12b is effectively prevented as long as the spot welding is conducted at the left side of the solder resist pattern 12b.

Further, with the embodiment of FIG. 6, the majority of the area of the land 2 is divided symmetrically into a part 2a and a part 2b with the horizontal part of the T-shaped solder resist pattern 12b. Thus, drifting of the metal plate 4 at the time of soldering upon the land 2 is effectively suppressed, and the metal plate 4 can be provided with high precision.

Further, because the land 2 is divided by the solder resist pattern 12b, which extends from inside of the area of the land 2 to the outside thereof, formation of pores between the land 2 and the metal plate 4 is suppressed when the metal plate 4 is soldered upon the land 2. Thereby, substantial area of soldering is increased, and the bonding strength of the metal plate 4 to the land 2 is improved.

Figure 7:
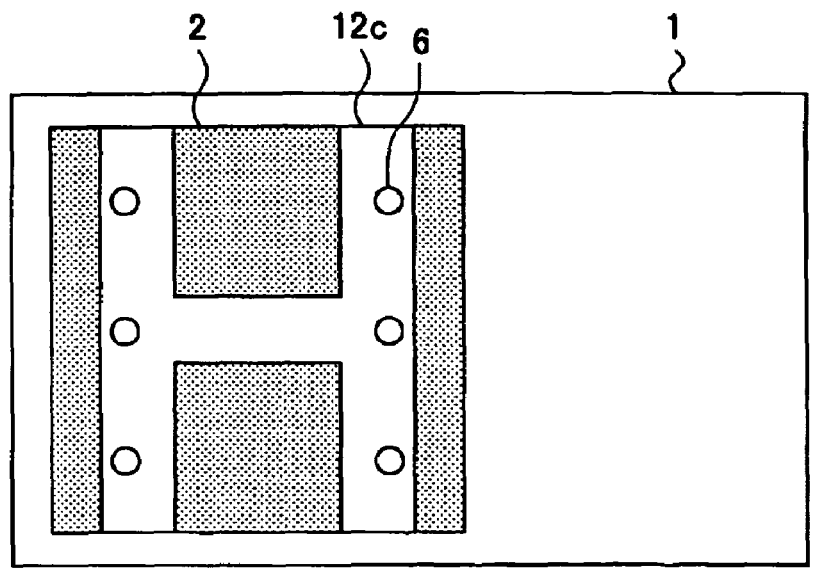
FIG. 7 is a plan view diagram showing the external interconnection terminal of the printed circuit board according to a further embodiment of the present invention.

In the example of FIG. 7 showing a printed circuit board 60C, there is provided an H-shaped solder resist pattern 12c on the land 2. In this example, too, it can be seen that there are provided plural through-holes 6. While the positional relationship between the through-holes 6 and the solder resist pattern 12c is not limited, the illustrated example has a construction of disposing the through-holes 6 inside the vertical parts of the H-shaped solder resist pattern 12c.

By forming the through-holes 6 and the solder resist pattern 12c of H-shaped form as such, not only the bonding strength of the land 2 and the base substrate 1 of the printed circuit board is improved by way of the through-holes 6 but also the efficiency of heat dissipation at the time of spot welding of a metal plate upon the metal plate 4 soldered to the land 2. The heat dissipates to the base substrate 1 via the through holes 6. Thereby, the molten solder alloy is held by the solder resist layer 12c, and thus, scattering of the molten solder alloy to the outside in the right and left directions of the vertical pattern parts of the H-shaped solder resist pattern 12c is effectively prevented as long as the spot welding is conducted inside of the two vertical patterns of the H-shaped solder resist pattern 12c.

Further, with the embodiment of FIG. 7, too, the majority of the area of the land 2 is divided symmetrically into plural parts by the H-shaped solder resist pattern 12c. Thus, drifting of the metal plate 4 at the time of soldering upon the land 2 is effectively suppressed, and the metal plate 4 can be provided with high precision.

Further, because the land 2 is divided by the solder resist pattern 12c, which extends from inside of the area of the land 2 to the outside thereof, formation of pores between the land 2 and the metal plate 4 is suppressed when the metal plate 4 is soldered upon the land 2. Thereby, substantial area of soldering is increased, and the bonding strength of the metal plate 4 to the land 2 is improved.

Figure 8:
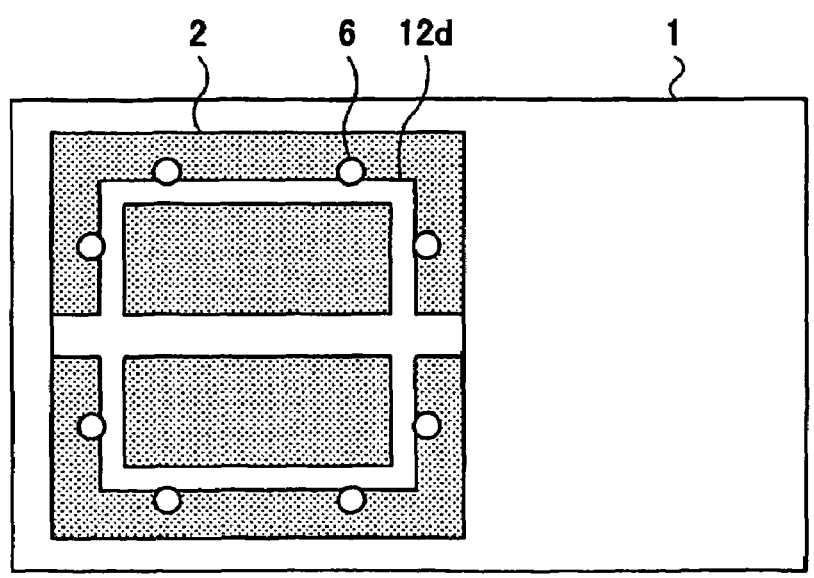
FIG. 8 is a plan view diagram showing the external interconnection terminal of the printed circuit board according to a further embodiment of the present invention.

In the example of FIG. 8 showing a printed circuit board 60D, there is provided a frame-like solder resist pattern 12d on the land 2 having a horizontal pattern part extending laterally and dividing the area of the land 2 symmetrically into upper and lower parts. In this example, too, it can be seen that there are provided plural through-holes 6. While the positional relationship between the through-holes 6 and the solder resist pattern 12d is not limited, the illustrated example has a construction of disposing the through-holes 6 along the frame-shaped part of the solder resist pattern 12d at the outside thereof.

By forming the through-holes 6 and the solder resist pattern 12d of symmetric form as such, not only the bonding strength of the land 2 and the base substrate 1 of the printed circuit board is improved by way of the through-holes 6 but also the efficiency of heat dissipation at the time of spot welding of a metal plate 4 soldered upon the metal plate 4 soldered to the land 2. The heat dissipates to the base substrate 1 via the through holes 6. Thereby, the molten solder alloy is held by the solder resist layer 12d, and thus, scattering of the molten solder alloy to the outside of the frame-like solder resist pattern 12d is effectively prevented as long as the spot welding is conducted inside the framework of the solder resist pattern 12d.

Further, with the embodiment of FIG. 8, too, the majority of the area of the land 2 is divided symmetrically into plural parts by the solder resist pattern 12d. Thus, drifting of the metal plate 4 at the time of soldering upon the land 2 is effectively suppressed, and the metal plate 4 can be provided with high precision.

Further, because the land 2 is divided by the solder resist pattern 12d, which extends from inside of the area of the land 2 to the outside thereof, formation of pores between the land 2 and the metal plate 4 is suppressed when the metal plate 4 is soldered upon the land 2. Thereby, substantial area of soldering is increased, and the bonding strength of the metal plate 4 to the land 2 is improved.

Fourth Embodiment

Figure 9A:
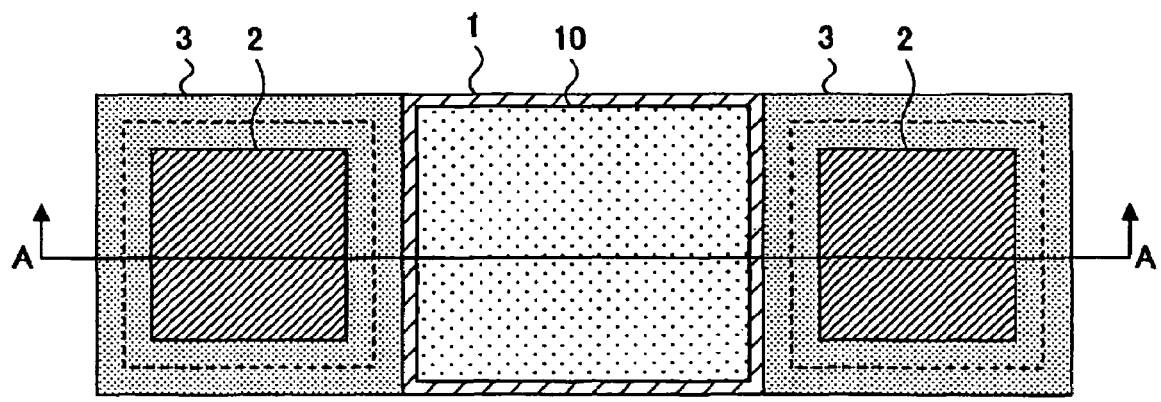
Figure 9B:
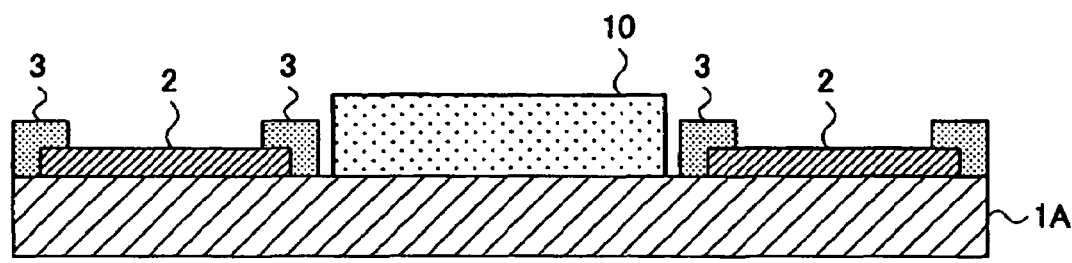
FIG. 9B is a cross-sectional diagram taken along an A-A line in FIG. 9A.

FIG. 9A shows the construction of a printed circuit board 70 according to a fourth embodiment of the present invention in a plan view while FIG. 9B shows the printed circuit board 70 in a cross-sectional view taken along a line A-A of FIG. 9A, wherein those parts corresponding to the parts described previously are designated by the same reference numerals and the description thereof will be omitted.

Referring to FIGS. 9A and 9B, it can be seen that there is provided no through-holes 6 and that no land is provided at the rear side of the base substrate 1.

On the other hand, the present embodiment provides a solder resist layer 3 for increasing the resistance of the land 2 from being pulled off from the base substrate 1, such that the solder resist layer 3 extends continuously from the peripheral edge part of the land to the part of the surface of the base substrate 1 surrounding the land 2.

Thus, by covering the peripheral edge of the land 2 with the solder resist layer 3, the resistance of the land 2 from being pulled off from the printed circuit board 1 is improved further.

Fifth Embodiment

Figure 10A:
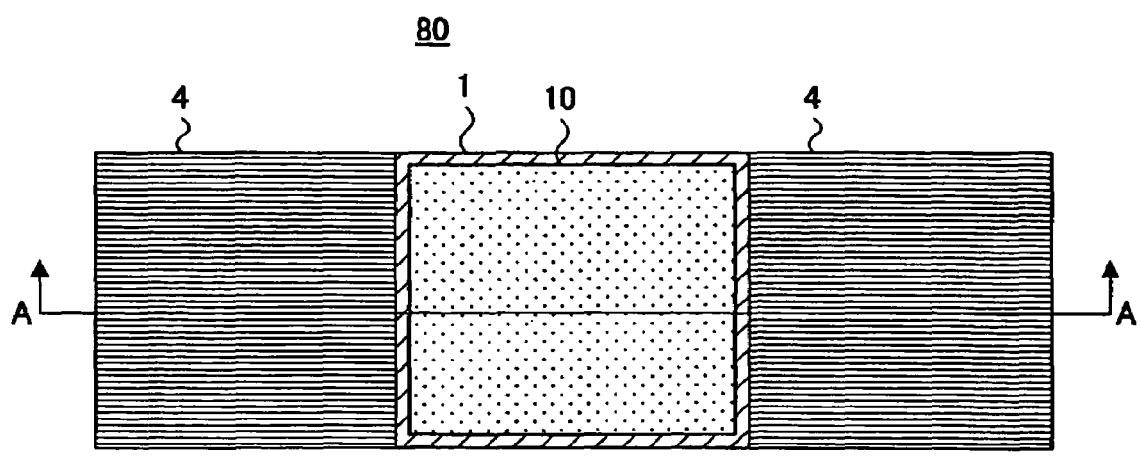
Figure 10B:
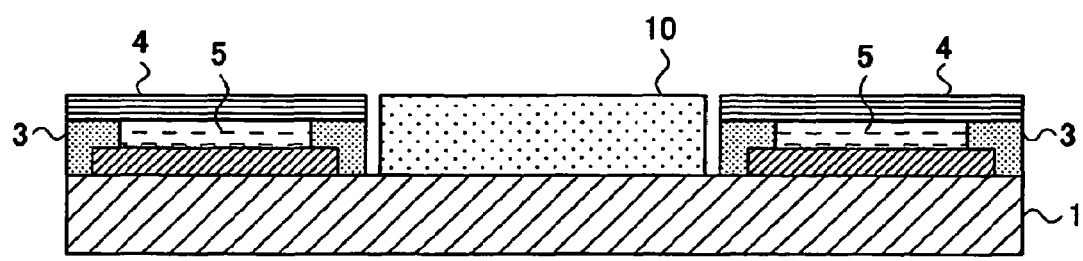
FIG. 10B is a cross-sectional diagram taken along an A-A line in FIG. 10A.

FIG. 10A shows the construction of a printed circuit board 80 according to a fifth embodiment of the present invention in a plan view while FIG. 10B shows the printed circuit board 80 in a cross-sectional view taken along a line A-A of FIG. 10A, wherein those parts corresponding to the parts described previously are designated by the same reference numerals and the description thereof will be omitted.

Referring to FIGS. 10A and 10B, it can be seen that the printed circuit board 80 has a construction in which the metal plate 4 is soldered upon the land 2 of the printed circuit board 70 of FIGS. 9A and 9B.

Because the land 2 is reinforced by the solder resist layer 3 as explained with reference to FIGS. 9A and 9B, peeling off or dropping of the external interconnection terminal from the printed circuit board 1 is effectively prevented even when a large force is exerted to the metal plate 4 as in the case of spot welding of an electrode of an external electronic apparatus such as a secondary battery to the metal plate 4. Further, because of the existence of the solder resist layer 3, scattering of the molten resist is prevented by the solder resist layer 3 at the time of spot welding of an electrode of external electronic apparatus such as a secondary battery to the metal plate 4.

Sixth Embodiment

Figure 11A:
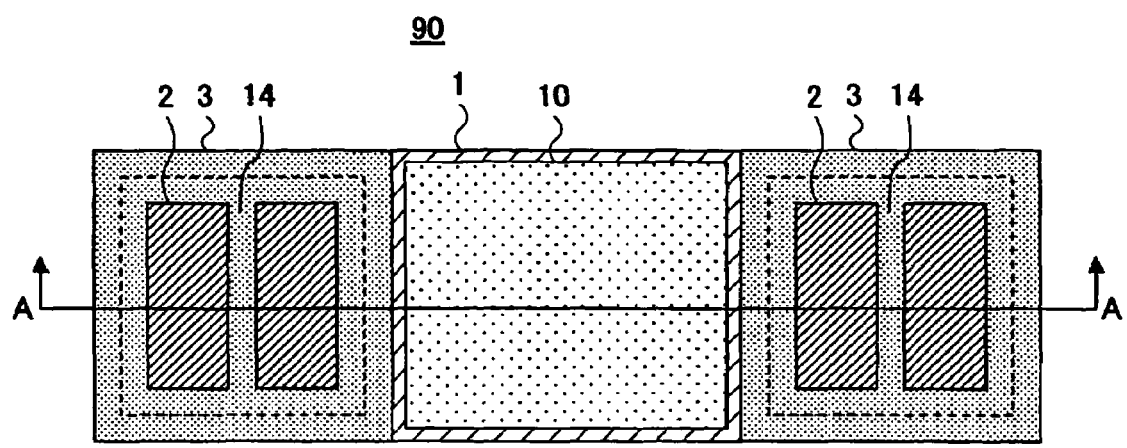
Figure 11B:
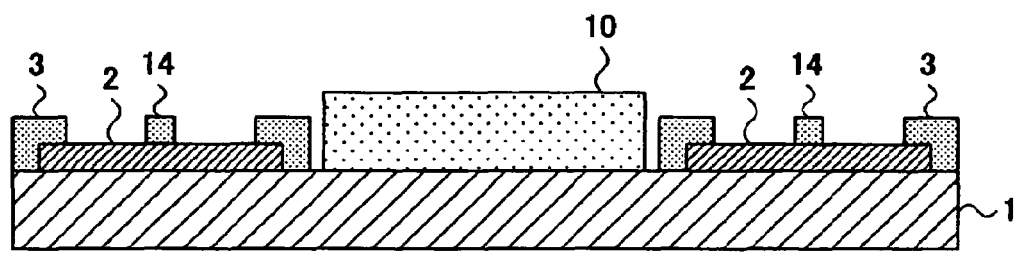
FIG. 11B is a cross-sectional diagram taken along an A-A line in FIG. 11A.

FIG. 11A shows the construction of a printed circuit board 90 according to a sixth embodiment of the present invention in a plan view while FIG. 11B shows the printed circuit board 90 in a cross-sectional view taken along a line A-A of FIG. 11A, wherein those parts corresponding to the parts described previously are designated by the same reference numerals and the description thereof will be omitted.

Referring to FIGS. 11A and 11B, it can be seen that the printed circuit board 90 has a construction similar to that of the printed circuit board 70 of FIGS. 9A and 9B in that the solder resist layer 3 is provided for the purpose of increasing resistance of the land 2 from being pulled off from the base substrate 1, such that the solder resist layer 3 extends continuously from the peripheral edge part of the land to the part of the surface of the base substrate 1 surrounding the land 2. Further, with the present embodiment, there is formed a solder resist pattern 14 on the land 2 in continuation with the solder resist layer 3 at the peripheral edge of the land 2 so as to divide the area of the land 2 into two regions.

With the present embodiment, the solder resist layer 3 functions similarly to the embodiment of FIGS. 9A and 9B.

Further, the solder resist pattern 14 dividing the exposed area of the land 2 into two sub-regions facilitates elimination of pores at the time of soldering the metal plate 4 to the land 2 by causing the printed circuit board 90 to pass through a reflowing furnace in the state that the metal 4 is placed on the land 2. Thereby, effective soldering area of the metal plate 4 to the land 2 is increased and the bonding strength of the metal plate 4 to the land 2 is improved.

While the embodiment of FIG. 11 divides the exposed part of the land 2 into two sub-regions by the solder resist layer 3 and the solder resist pattern 14, the number of division of the land area is not limited to two, and the solder resist layer 3 and the solder resist pattern 14 can be optimized with regard to the number of the sub-regions formed as a result of the division or the shape of the sub-regions according to the size of the land 2.

Seventh Embodiment

Figure 12A:
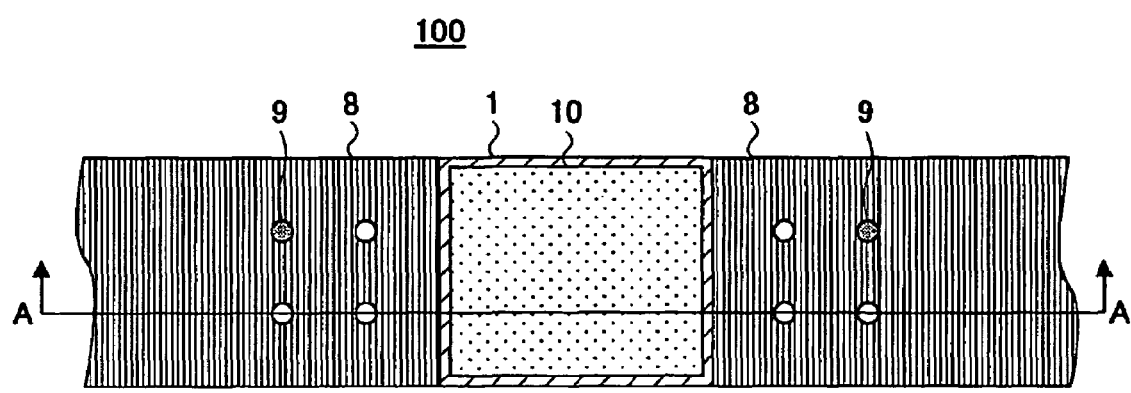
Figure 12B:
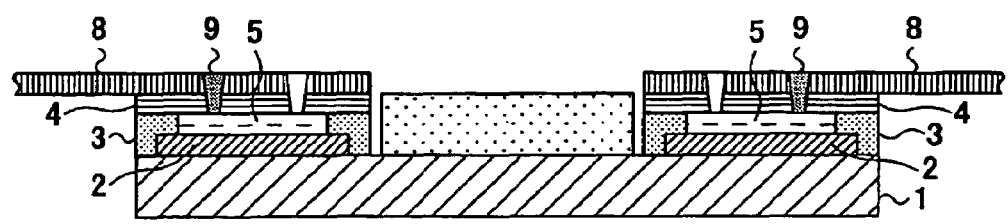
FIG. 12B is a cross-sectional diagram taken along an A-A line in FIG. 12A.

FIG. 12A shows the construction of a printed circuit board 100 according to a seventh embodiment of the present invention in a plan view while FIG. 12B shows the printed circuit board 100 in a cross-sectional view taken along a line A-A of FIG. 12A, wherein those parts corresponding to the parts described previously are designated by the same reference numerals and the description thereof will be omitted.

Referring to FIGS. 12A and 12B, the printed circuit board 100 has a construction of the printed circuit board 80 of FIGS. 10A and 10B except that a metal plate 8, which may be the member connected to the electrode of an external apparatus such as a secondary battery, is connected to the metal plate 4 by way of spot welding.

Thus, the metal plate 8 is laid on the metal plate 4, and spot welding is conducted at four locations 9 in this state. However, the number of the locations 9 of the spot welding is not limited to four but can be increased or decreased according to the size of the metal plate 4. Further, the location 9 of the spot welding can be optimized in consideration of the part of where the external force acting to pull out the external interconnection terminal becomes maximum at the time of the spot welding.

Further, while FIGS. 12A and 12B show the case of spot-welding the second metal plate 8 to the metal plate 4 constituting the external interconnection terminal of the printed circuit board 80 of FIGS. 10A and 10B, such spot welding can be conducted in the printed circuit board of other embodiments.

In one important application of the present invention, the metal plate 8 constitutes a part of the metal plate having an end spot-welded to an electrode of a battery pack, or the like. In such a case, it is preferable to form both the metal plate 4 and the metal plate 8 by nickel or an alloy containing nickel as a primary component.

Eighth Embodiment

Figure 13:
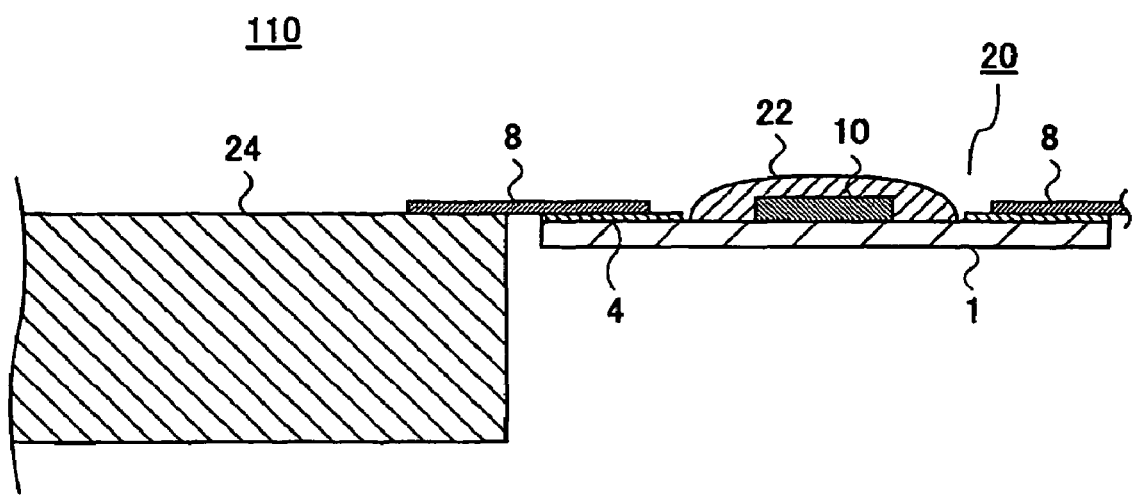
FIG. 13 is a cross-sectional diagram showing an electronic apparatus according to a further embodiment of the present invention.

FIG. 13 is a diagram showing the construction of an electronic apparatus 110 that includes a printed circuit assembly carrying an electronic component on a printed circuit board according to an eight embodiment of the present invention, wherein those parts corresponding to the parts explained previously are designated by the same reference numerals and the description thereof will be omitted.

Referring to FIG. 13, the electronic apparatus 110 is a secondary battery pack including therein a secondary battery 24 used with portable apparatuses such as a cellular phone, wherein the secondary battery pack 110 further includes a printed circuit assembly 20 including a charging control circuit of the secondary battery 24 in the form of a semiconductor integrated circuit mounted upon the base substrate 1 of any of the printed circuit boards of the preceding embodiments as an electronic component 10. It should be noted that the electronic component 10 is sealed by a resin such as an epoxy resin.

In the construction of FIG. 13, a nickel plate is used for the metal plate 4 forming the external interconnection terminal in the printed circuit assembly 20, wherein the metal plate 8 connected to the electrode of the secondary battery 24 is formed also of a nickel plate. Thereby, the metal plate 4 and the metal plate 8 are connected with each other by spot welding as explained with reference to FIGS. 12A and 12B.

According to the printed circuit board of the present invention, the resistance of the external interconnection terminal thereof from being pulled off is increased, and thus, the printed circuit board is suitable for use with compact portable apparatuses.

Further, the present invention is by no means limited to the embodiments described heretofore, but various variations and modifications may be made without departing from the scope of the invention.

The invention claimed is:

1. A printed circuit board, comprising:
a base substrate; and
an external interconnection terminal provided on said base substrate,
said external interconnection terminal comprising a land formed on a front surface of said base substrate and a metal plate soldered upon said land via a solder layer,
a through-hole being formed in said base substrate such that said through-hole penetrates through said land and through said base substrate,
said through-hole being filled with a solder such that said solder in said through-hole extends in continuation to said solder layer connecting said metal plate to said land,
wherein said through-hole is provided in plural numbers in each land and said solder layer is formed over said plural numbers of through-holes.

2. The printed circuit board as claimed in claim 1, wherein said base substrate carries a second land on a rear surface thereof so as to oppose to said land on said front surface, said land on said front surface and said second land on said rear surface being connected with each other by said solder filing said through-hole.

3. The printed circuit board as claimed in claim 1, further comprising a solder resist layer on said front surface of said base substrate such that said solder resist layer covers a peripheral edge part of said land, said solder resist layer extending in continuation to a part of said front surface of said base substrate surrounding said land.

4. The printed circuit board as claimed in claim 1, further comprising a solder resist layer on said land in a part offset from a peripheral edge of said land.

5. The printed circuit board as claimed in claim 4, wherein said solder resist layer forms a pattern dividing an area of said land connected to said metal plate by said solder layer into sub-regions.

6. The printed circuit board as claimed in claim 5, wherein said solder resist pattern extends to an outside of said land.

7. The printed circuit board as claimed in claim 3, wherein there is formed a solder resist pattern in a part of said land offset form said peripheral edge part, said solder resist pattern and said solder resist layer dividing an area of said land soldered to said metal plate by said solder layer into sub-regions.

8. The printed circuit board as claimed in claim 1, wherein said solder resist layer is used also for covering an interconnection pattern formed on said base substrate.

9. The printed circuit board as claimed in claim 1, wherein said metal plate has an area larger than an area of said land, said metal plate being placed on said land so as to cover entirety of said land.

10. A printed circuit board comprising:
a base substrate; and
an external interconnection terminal provided on said base substrate,
said external interconnection terminal comprising a land formed on a surface of said base substrate and a metal plate soldered upon said land via a solder layer, said solder layer being formed over a plurality of through-holes in each said land, wherein there is provided a solder resist layer covering a peripheral edge part of said land such that said solder resist layer extends in continuation to a part of said surface of said base substrate surrounding said land.

11. The printed circuit board as claimed in claim 10, further comprising a solder resist pattern on an area of said land offset from said peripheral edge part.

12. The printed circuit board as claimed in claim 11, wherein said solder resist pattern divides an area of said land soldered to said metal plate by said solder layer into plural sub-regions.

13. The printed circuit board as claimed in claim 11, wherein said solder resist layer and said solder resist pattern divide an area of said land soldered to said metal plate by said solder layer into plural sub-regions.

14. The printed circuit board as claimed in claim 10, wherein said solder resist layer is used also for covering an interconnection pattern formed on said base substrate.

15. The printed circuit board as claimed in claim 10, wherein said metal plate has an area larger than an area of said land, said metal plate being placed on said land so as to cover entirety of said land.

16. A printed circuit assembly, comprising:
an electronic component; and
a printed circuit board comprising a printed circuit substrate, the printed circuit substrate further comprising:
a base substrate; and
an external interconnection terminal provided on said base substrate, said external interconnection terminal comprising a land formed on a front surface of said base substrate and a metal plate soldered upon said land via a solder layer, a through-hole being formed in said base substrate being such that said through-hole penetrates through said land and through said base substrate, said through-hole being filled with a solder such that said solder in said through-hole extends in continuation to said solder layer connecting said metal plate to said land;
wherein the electronic component is mounted on the printed circuit board, and
wherein said through-hole is provided in plural numbers in each land and said solder layer is formed over said plural numbers of through-holes.

17. A printed circuit assembly, comprising:
a printed circuit board comprising: a base substrate; and an external interconnection terminal provided on said base substrate, said external interconnection terminal comprising a land formed on a surface of said base substrate and a metal plate soldered upon said land via a solder layer, wherein there is provided a solder resist layer covering a peripheral edge part of said land such that said solder resist layer extends in continuation to a part of said surface of said base substrate surrounding said land, and said solder layer being formed over a plurality of through-holes in each said land; and
an electronic component mounted on said printed circuit board.

18. An electronic apparatus, comprising:
a printed circuit substrate comprising: a base substrate; and an external interconnection terminal provided on said base substrate, said external interconnection terminal comprising a land formed on a front surface of said base substrate and a metal plate soldered upon said land via a solder layer, a through-hole being formed in said base substrate being such that said through-hole penetrates through said land and through said base substrate, said through-hole being filled with a solder such that said solder in said through-hole extends in continuation to said solder layer connecting said metal plate to said land;
an electronic component mounted on said printed circuit board; and
an electronic device having a metal plate terminal, said electronic device being connected to said printed circuit board by connecting said metal plate terminal to said metal plate of said external interconnection terminal by way of spot welding, wherein said through-hole is provided in plural numbers in each land and said solder layer is formed over said plural numbers of through-holes.

19. The electronic apparatus as claimed in claim 18, wherein said metal plate terminal of said electronic device and said metal plate of said external interconnection terminal comprises any of nickel or a nickel alloy.

20. An electronic apparatus as claimed in claim 18, wherein said electronic apparatus comprises a secondary battery pack including therein a secondary battery as said electronic device, said printed circuit board carrying a charging control circuit of said secondary battery as said electronic component.

21. An electronic apparatus, comprising:
a printed circuit board comprising: a base substrate; and an external interconnection terminal provided on said base substrate, said external interconnection terminal comprising a land formed on a surface of said base substrate and a metal plate soldered upon said land via a solder layer, wherein there is provided a solder resist layer covering a peripheral edge part of said land such that said solder resist layer extends in continuation to a part of said surface of said base substrate surrounding said land, and said solder layer being formed over a plurality of through-holes in each said land;
an electronic component mounted on said printed circuit board; and
an electronic device having a metal plate terminal, said electronic device being connected to said printed circuit board by connecting said metal plate terminal to said metal plate of said external interconnection terminal by way of spot welding.

22. The electronic apparatus as claimed in claim 21, wherein said metal plate terminal of said electronic device and said metal plate of said external interconnection terminal comprises any of nickel or a nickel alloy.

23. An electronic apparatus as claimed in claim 21, wherein said electronic apparatus comprises a secondary battery pack including therein a secondary battery as said electronic device, said printed circuit board carrying a charging control circuit of said secondary battery as said electronic component.

24. A printed circuit board, comprising:
a base substrate, said base substrate being a multilayer interconnection substrate having internal circuit patterns embedded inside said base substrate; and
an external interconnection terminal provided on said base substrate, said external interconnection terminal further comprising:
a land formed on a front surface of said base substrate;
a solder resist layer on said front surface of said base substrate such that said solder resist layer covers a peripheral edge part of said land, said solder resist layer extending in continuation to a part of said front surface of said base substrate surrounding said land; and a metal plate soldered upon said land via a solder layer, wherein a through-hole is formed in said base substrate such that said through-hole penetrates through said land and through said base substrate, said through-hole being provided with conductive plating at an inner wall surface thereof and being filled with a solder such that said solder in said through-hole extends in continuation to said solder layer connecting said metal plate to said land, wherein said solder resist layer forms a solder resist pattern dividing an area of said land into substantially equal sub-regions, and wherein said through-hole is provided in plural numbers in each land and said solder layer is formed over said plural numbers of through-holes, and said through-holes providing electrical interconnection between said internal circuit patterns and said land.

25. The printed circuit board of claim 24, wherein said metal plate has an area larger than an area of said land so as to cover entirety of said land.

26. A printed circuit board, comprising:
a base substrate; and
an external interconnection terminal provided on said base substrate, said external interconnection terminal further comprising:
  a land formed on a front surface of said base substrate;
  a solder resist layer on said front surface of said base substrate such that said solder resist layer covers a peripheral edge part of said land, said solder resist layer extending in continuation to a part of said front surface of said base substrate surrounding said land; and
  a metal plate soldered upon said land via a solder layer,
wherein said solder resist layer forms a solder resist pattern on said land, said solder resist pattern having a horizontal pattern part extending laterally and dividing an area of said land substantially symmetrically into upper and lower parts,
wherein a through-hole is formed in said base substrate such that said through-hole penetrates through said land and through said base substrate, said through-hole being provided with conductive plating at an inner wall surface thereof and being filled with a solder such that said solder in said through-hole extends in continuation to said solder layer connecting said metal plate to said land,
wherein said through-hole is provided in plural numbers in each land and said solder layer is formed over said plural numbers of through-holes, and
wherein said plural numbers of through-holes are disposed along an outside of said horizontal pattern.

27. The printed circuit board of claim 26, wherein said base substrate carries a second land on a rear surface thereof so as to oppose to said land on said front surface, said land on said front surface and said second land on said rear surface being connected with each other by said solder filing said through-hole.

28. A printed circuit board, comprising:
a base substrate; and
an external interconnection terminal provided on said base substrate, said external interconnection terminal further comprising:
  a land formed on a front surface of said base substrate;
  a solder resist layer on said front surface of said base substrate such that said solder resist layer covers a peripheral edge part of said land, said solder resist layer extending in continuation to a part of said front surface of said base substrate surrounding said land; and
  a metal plate soldered upon said land via a solder layer,
wherein said solder resist layer forms a solder resist pattern on said land, said solder resist pattern having a shape and dividing majority of an area of said land substantially symmetrically into plural regions,
wherein a through-hole is formed in said base substrate such that said through-hole penetrates through said land and through said base substrate, said through-hole being provided with conductive plating at an inner wall surface thereof and being filled with a solder such that said solder in said through-hole extends in continuation to said solder layer connecting said metal plate to said land,
wherein said through-hole is provided in plural numbers in each land and said solder layer is formed over said plural numbers of through-holes, and
wherein said plural numbers of through-holes are disposed along inside of a part of said solder resist pattern.

29. The printed circuit board of claim 28, wherein said shape of said solder resist pattern is an H-shape.

30. The printed circuit board of claim 28, wherein said shape of said solder resist pattern is a T-shape.

31. The printed circuit board of claim 28, wherein said part of said solder resist pattern is a vertical part.

* * * * *

UNITED STATES PATENT AND TRADEMARK OFFICE
CERTIFICATE OF CORRECTION

| | |
|---|---|
| PATENT NO. | : 7,381,066 B2 |
| APPLICATION NO. | : 10/580261 |
| DATED | : June 3, 2008 |
| INVENTOR(S) | : Masahiro Higashiguchi et al. |

It is certified that error appears in the above-identified patent and that said Letters Patent is hereby corrected as shown below:

Title Page; item 22;

change "Sep. 29, 2005" to --Sep. 21, 2005--.

Signed and Sealed this

Thirtieth Day of June, 2009

JOHN DOLL
*Acting Director of the United States Patent and Trademark Office*